US005926554A

United States Patent [19]

Hasenmaier

[11] Patent Number: 5,926,554

[45] Date of Patent: Jul. 20, 1999

[54] PICKUP AMPLIFIER SYSTEM FOR PUBLIC ADDRESS SYSTEM

[76] Inventor: Jürgen Hasenmaier, Wagnerstr, 3, 89518, Heidenheim, Germany

[21] Appl. No.: 08/605,788

[22] Filed: Feb. 22, 1996

[30] Foreign Application Priority Data

Mar. 7, 1995 [DE] Germany .......................... 195 07 850

[51] Int. Cl.[6] ...................................................... H03G 3/00

[52] U.S. Cl. ................................ 381/61; 381/62; 381/91; 381/96; 381/122

[58] Field of Search ......................... 381/82, 122, 61–62, 381/96, 75–77, 90–91, 335, 111, 87

[56] References Cited

U.S. PATENT DOCUMENTS

| | | | |
|---|---|---|---|
| 2,830,118 | 4/1958 | Kohler | 381/76 |
| 3,023,274 | 2/1962 | Shaw | 381/75 |
| 3,126,450 | 3/1964 | Neil | 381/76 |
| 3,443,031 | 5/1969 | Bolick | 381/76 |
| 3,848,944 | 11/1974 | Gilmer | 381/76 |
| 4,166,926 | 9/1979 | Sieler | 381/76 |
| 4,437,189 | 3/1984 | Newman | 381/91 |
| 4,592,088 | 5/1986 | Shimada | 381/96 |
| 5,649,015 | 7/1997 | Paddock et al. | 381/61 |

*Primary Examiner*—Curtis A. Kuntz
*Assistant Examiner*—Duc Nguyen
*Attorney, Agent, or Firm*—George Pappas

[57] ABSTRACT

A pickup amplifier system for a public address system including an amplifier, an amplifier box and a speaker simulator microphone wired between amplifier and amplifier box.

The amplifier system is characterized by the following features:

the speaker simulator is arranged in the area of the amplifier box, close by or on its front face; and, an acoustic pickup is arranged directly before on the front face of the amplifier box.

4 Claims, 3 Drawing Sheets

PICKUP AMPLIFIER SYSTEM FOR PUBLIC ADDRESS SYSTEM

TECHNICAL FIELD

The invention concerns a pickup amplifier system for a public address system.

BACKGROUND OF THE INVENTION

Amplifier systems are very popular. They are used both in enclosed spaces and also in open-air operations.

SUMMARY OF THE INVENTION

The general requirements to be met by such systems are high power, great diversity and the ability to adapt to the circumstances of the surroundings, space and audience.

The objective underlying the invention is to improve a pickup amplifier system for a public address system of claim 1 so as to be able to meet the said requirements to a still greater degree.

This is accomplished by a pickup amplifier system for a public address system including an amplifier, an amplifier box and a speaker simulator microphone wired between the amplifier and amplifier box. The pickup amplifier system is characterized in that the speaker simulator is arranged in close vicinity to or on the front of the amplifier box and an acoustic pickup is arranged directly in front of the amplifier box.

Accordingly, such a system is constructed as follows:

The musical instrument concerned, notably a guitar, is in customary manner connected electronically to an amplifier. In turn, the amplifier feeds to an amplifier box. Wired between the amplifier and amplifier box may be a so-called speaker simulator—which is previously known as well.

According to the idea underlying the invention, however, the speaker simulator is coordinated directly with the amplifier box. To that end, the speaker amplifier according to the invention is suitably arranged directly on the amplifier box, and at that, on its front. The speaker amplifier is given a specific shape, which best encompasses a circular segment, making it possible to assign it to one of the speakers in the amplifier box in such a way that the said circular segment is concentric with the speaker. Such speaker simulator is arranged suitably in the front region of the amplifier box.

Moreover—and as well according to the invention—an acoustic pickup is assigned to the front of the amplifier box, and at that, directed at the sound source—that is, at one of the speakers contained in the amplifier box. The choice of acoustic pickup comprises nearly any embodiment, notably a microphone.

The arrangement relative to the amplifier box need not be directly in the sound axis of the respective speaker, but may be more or less eccentric as well. Important is that the acoustic pickup is so arranged relative to the speaker that it picks up the signal of the speaker, and not the signals from the surroundings. The distance between speaker front and acoustic pickup ranges normally between 10 and 30 cm; 20 cm will generally be optimal.

Accomplished by these surprisingly simple measures, in detail, is the following:

A sound is generated which is a combination between the real acoustic signal and a simulated signal generated by the speaker simulator. The mixing ratio between both signals is adjustable. The arrangement may be such that the adjustment can be made by the musician himself/herself. The musician is thus able to personally adjust the mixing ratio as well as various filters of the said signals for his own instrument.

This allows influencing the circumstances which otherwise cannot be influenced:

- the parameters of the amplifier;
- the parameters of the loudspeaker;
- the stage conditions;
- the conditions of the surroundings (enclosed space or open air);
- the audience conditions;
- the diversity of studio situations, or CD recordings.

Figure 1:
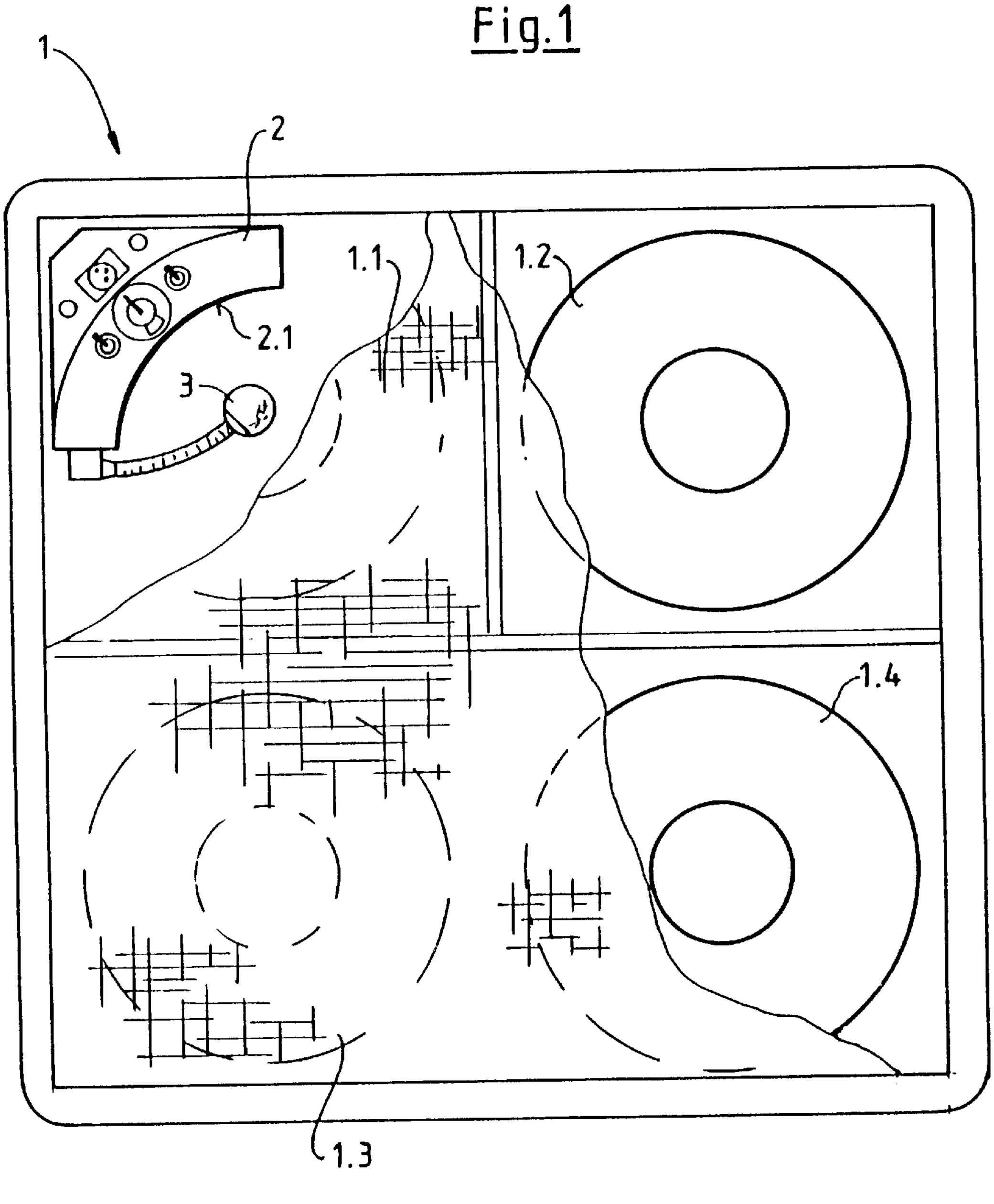
FIG. 1 is a front plan view of an amplifier box and pickup amplifier system for a public address system constructed in accordance with the principles of the present invention.

Referring to the drawings, FIG. 1 shows a plan view of an amplifier box 1 of a pickup amplifier system for a public address system. Visible are totally four loudspeakers 1.1, 1.2, 1.3, 1.4.

Arranged on the front of amplifier box 1 is a speaker simulator 2, located in the area of the left upper corner of amplifier box 1. Its shape is such that it occupies more or less the corner area without impairing the function of loudspeaker 1.1. Hence, it has a bounding wall 2.1 that is concentric with the speaker 1.1.

Of major significance, moreover, is that directly before the front of amplifier box 1 there is an acoustic pickup 3 arranged, presently a microphone.

The microphone is arranged directly on the speaker simulator 2. The distance between microphone 3 and front of amplifier box 1 is presently 20 cm.

Figure 2:
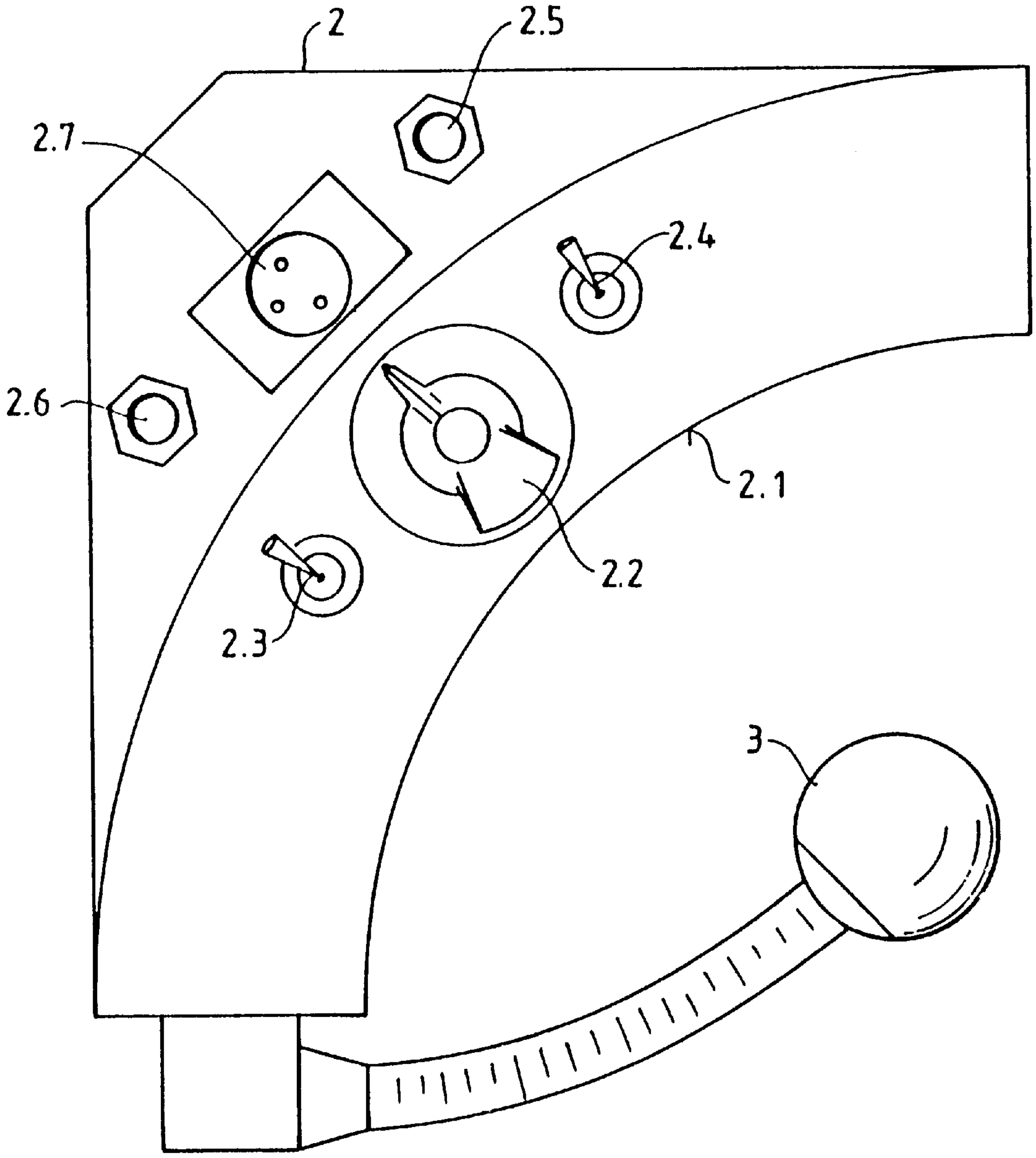
FIG. 2 is an enlarged view of the speaker simulator and microphone shown in FIG. 1; and, FIG. 3 is a perspective partial view of a pickup amplifier system for a public address system constructed in accordance with principles of the present invention.
Figure 3:
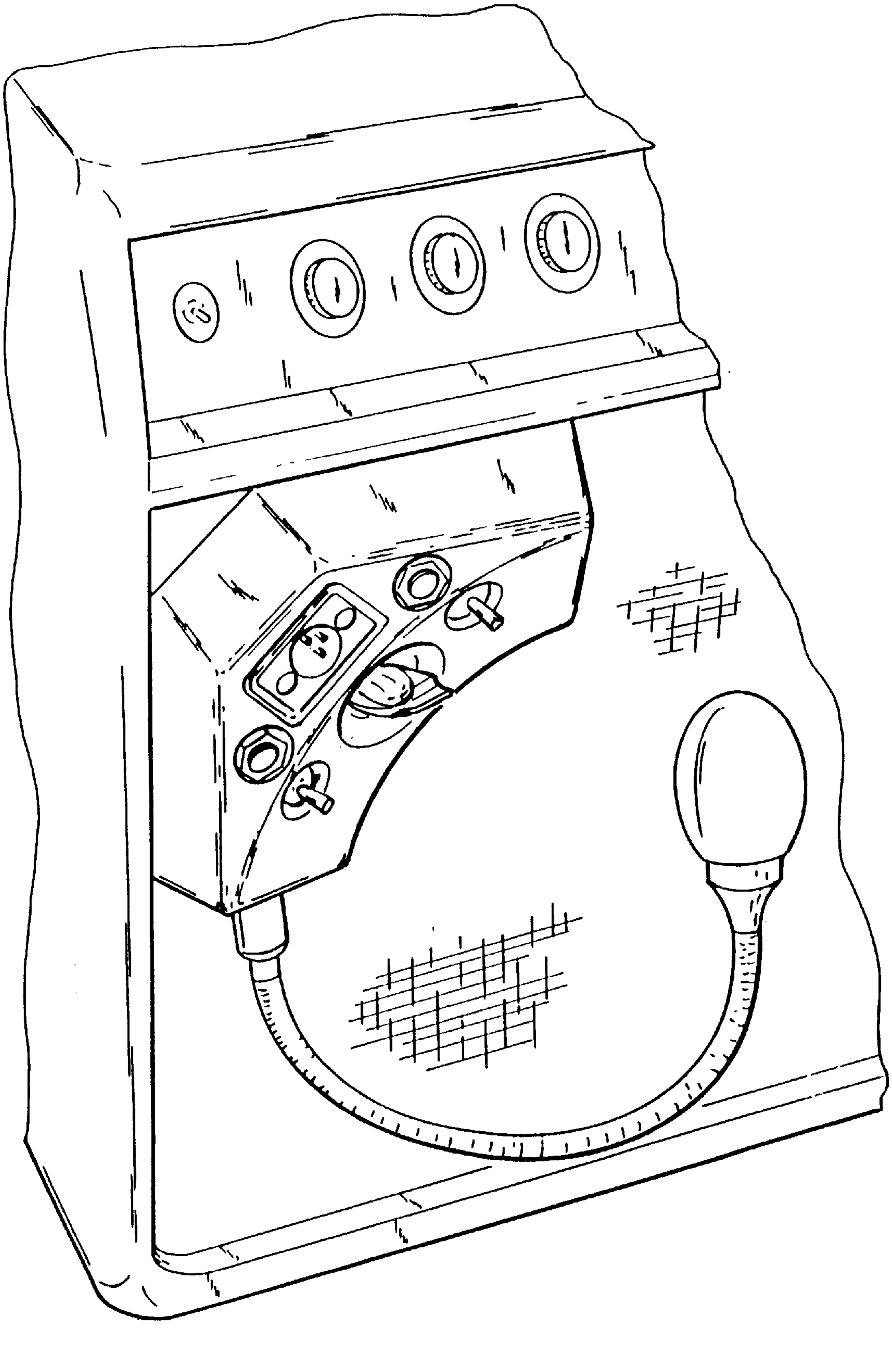

FIG. 2, scaled up, shows the speaker simulator 2 with microphone 3. Moreover, speaker simulator 2 comprises the following elements:

a D-R-S mixer 2.2, a first and a second filter switch 2.3 and 2.4, and input 2.5 for the amplifier, an output 2.6 for the loudspeaker, and a D-R-S output 2.7.

What is claimed is:

1. A pickup amplifier system for a public address system, with an amplifier;
   - with an amplifier box;
   - with a speaker simulator microphone, wired between the amplifier and amplifier box;
   - whereby the speaker simulator microphone is arranged in the area of the amplifier box, in close vicinity or on its front; and,
   - an acoustic pickup is arrange directly before the front of the amplifier box, characterized in that:
   - the acoustic pickup allows selective positioning relative to the sound-radiating front face of the amplifier box relative to the axis of the loudspeaker assigned to it, as well as in terms of its spacing from the front face of the amplifier box such that a sound is generated which is a combination between a real acoustic signal and a simulated signal generated by the speaker simulator microphone, whereby the mixing ratio between both signals is adjustable, and further wherein the speaker simulator microphone is on the amplifier box front wall and has a contour with a circular arc that is concentric with the loudspeaker located thereat.

2. The amplifier system according to claim 1, characterized in that the speaker simulator microphone is supported by the amplifier box.

3. The amplifier system according to claim 1, characterized in that the acoustic pickup is supported by the amplifier box.

4. The amplifier system according to claim 2, characterized in that the acoustic pickup is supported by the amplifier box.

* * * * *

UNITED STATES PATENT AND TRADEMARK OFFICE

CERTIFICATE OF CORRECTION

PATENT NO. : 5,926,554

DATED : July 20, 1999

INVENTOR(S) : Jurgen Hasenmaier

It is certified that error appears in the above-identified patent and that said Letters Patent is hereby corrected as shown below:

Col. 1, lines 18-19, delete "of claim 1".

Col. 1, after line 39, insert title --DESCRIPTION OF A SPECIAL EMBODIMENT--.

Signed and Sealed this

Eighteenth Day of January, 2000

Attest:

Q. TODD DICKINSON

*Attesting Officer* *Commissioner of Patents and Trademarks*